US012603655B1

(12) United States Patent
Sarkar et al.

(10) Patent No.: US 12,603,655 B1
(45) Date of Patent: Apr. 14, 2026

(54) SUBRANGING DIGITAL TO TIME CONVERTER-BASED FRACTIONAL PHASE LOCKED LOOP ARCHITECTURE

(71) Applicant: Cadence Design Systems, Inc., San Jose, CA (US)

(72) Inventors: Sudipta Sarkar, San Jose, CA (US); Angus McLaren, Dundas (CA); Meenakshi S., Bengaluru (IN); Priya T K, Bangalore (IN); Srivatsa Ranganatha, Bangalore (IN); Mohammed Ranjbar, San Jose, CA (US); Paul Lee, San Francisco, CA (US); Shwetabh Verma, Los Altos, CA (US); George Chung Fai Ng, Markham (CA)

(73) Assignee: Cadence Design Systems, Inc., San Jose, CA (US)

( * ) Notice: Subject to any disclaimer, the term of this patent is extended or adjusted under 35 U.S.C. 154(b) by 19 days.

(21) Appl. No.: 18/624,299

(22) Filed: Apr. 2, 2024

(51) Int. Cl.
*H03L 7/099* (2006.01)
*H03L 7/089* (2006.01)
*H03L 7/091* (2006.01)

(52) U.S. Cl.
CPC .......... *H03L 7/0992* (2013.01); *H03L 7/0891* (2013.01); *H03L 7/091* (2013.01); *H03L 2207/50* (2013.01)

(58) Field of Classification Search
None
See application file for complete search history.

(56) References Cited

U.S. PATENT DOCUMENTS 5,903,195 A * 5/1999 Lukes .................... H03L 7/095
331/8
7,362,839 B2 * 4/2008 Goth ................... H03F 3/45968
341/68
(Continued)

FOREIGN PATENT DOCUMENTS

CN 102017418 A * 4/2011 ............. H03L 7/183
CN 101958711 B * 2/2012 ............. H03L 7/093
(Continued)

OTHER PUBLICATIONS

X. Meng, L. Zhou, F. Lin and C.-H. Heng, "A Low-Noise Digital-to-Frequency Converter Based on Injection-Locked Ring Oscillator and Rotated Phase Selection for Fractional-N Frequency Synthesis," in IEEE Transactions on Very Large Scale Integration Systems, vol. 27, No. 6, pp. 1378-1389, Jun. 2019 (Year: 2019).*
(Continued)

*Primary Examiner* — Berhanu Tadese
(74) *Attorney, Agent, or Firm* — Mark H. Whittenberger; Holland & Knight LLP

(57) ABSTRACT

Embodiments included herein are directed towards a subranging digital to time converter-based fractional phase locked loop circuit. The circuit may include a digital to time converter and a phase detector circuit configured to receive a reference frequency and an output of the digital to time converter. The circuit may further include a phase frequency detector/charge pump circuit configured to receive the reference frequency and the output of the digital to time converter. The circuit may also include a loop filter and voltage-controlled oscillator circuit configured to receive an output of the phase frequency detector/charge pump circuit. The circuit may further include a divider circuit configured to receive an output of the voltage-controlled oscillator
(Continued)

circuit and to transmit a signal to the digital to time converter.

16 Claims, 9 Drawing Sheets

(56) References Cited

U.S. PATENT DOCUMENTS

| | | | | |
|---|---|---|---|---|
| 7,791,417 | B2 * | 9/2010 | Wang | H03L 7/113 331/25 |
| 7,961,033 | B2 * | 6/2011 | Meninger | H03L 7/0816 374/170 |
| 8,031,008 | B2 * | 10/2011 | Wang | H03L 7/087 331/25 |
| 8,077,822 | B2 * | 12/2011 | Sun | H03L 7/0802 375/376 |
| 8,126,041 | B2 * | 2/2012 | Kam | G01R 31/31709 375/360 |
| 8,385,394 | B2 * | 2/2013 | Kam | H03L 7/0818 375/360 |
| 8,471,611 | B2 * | 6/2013 | Sfikas | H04L 7/0337 327/147 |
| 8,803,627 | B1 * | 8/2014 | Xu | H03C 3/095 331/16 |
| 8,878,614 | B2 * | 11/2014 | Yin | H03L 7/099 331/10 |
| 8,896,386 | B2 * | 11/2014 | Lee | H03L 7/06 331/25 |
| 9,130,588 | B2 * | 9/2015 | Henzler | H03M 1/82 |
| 9,285,778 | B1 * | 3/2016 | Evans | H03L 7/1075 |
| 9,362,936 | B1 * | 6/2016 | Caffee | H03K 5/135 |
| 9,379,879 | B1 * | 6/2016 | Caffee | G04F 10/005 |
| 9,484,929 | B2 * | 11/2016 | Werker | H04L 7/033 |
| 9,520,890 | B1 * | 12/2016 | Ben-Bassat | H03M 1/1014 |
| 9,531,394 | B1 * | 12/2016 | Caffee | H03L 7/183 |
| 9,634,678 | B1 * | 4/2017 | Caffee | H03L 7/187 |
| 9,698,807 | B1 * | 7/2017 | Caffee | H03M 1/1033 |
| 9,705,515 | B1 * | 7/2017 | Lee | H03L 7/093 |
| 9,762,378 | B1 * | 9/2017 | Summers | H03L 7/085 |
| 9,804,573 | B1 * | 10/2017 | Drost | H03M 1/188 |
| 9,979,404 | B1 * | 5/2018 | Drost | H03F 3/2178 |
| 9,985,639 | B2 * | 5/2018 | Nonis | H03L 7/113 |
| 10,090,845 | B1 * | 10/2018 | Midha | H03L 7/081 |
| 10,158,366 | B2 * | 12/2018 | Galton | H03L 7/193 |
| 10,200,047 | B2 * | 2/2019 | Markulic | H03L 7/081 |
| 10,305,495 | B2 * | 5/2019 | Behel | H03L 7/06 |
| 10,520,901 | B2 * | 12/2019 | Wu | H03L 7/187 |
| 10,594,329 | B1 * | 3/2020 | Elkholy | H03L 7/081 |
| 10,601,431 | B2 * | 3/2020 | Caffee | G04F 10/005 |
| 10,693,482 | B2 * | 6/2020 | Caffee | G04F 10/005 |
| 10,707,854 | B2 * | 7/2020 | Wu | G04F 10/04 |
| 10,727,842 | B2 * | 7/2020 | Behel | H04L 7/02 |
| RE48,275 | E * | 10/2020 | Caffee | H03K 5/135 |
| 10,895,850 | B1 * | 1/2021 | Elkholy | G04F 10/005 |
| 10,911,054 | B2 * | 2/2021 | Yeo | H03L 7/093 |
| 10,917,078 | B2 * | 2/2021 | Wu | H03L 7/1976 |
| 10,996,634 | B2 * | 5/2021 | Yao | H03L 7/0805 |
| 11,171,654 | B1 * | 11/2021 | Hinrichs | H03L 7/0805 |
| 11,175,633 | B2 * | 11/2021 | Yao | H03M 1/12 |
| 11,245,403 | B2 * | 2/2022 | Sievert | G04F 10/005 |
| 11,411,569 | B2 * | 8/2022 | Moslehi Bajestan | H03L 7/0816 |
| 11,456,750 | B2 * | 9/2022 | Lin | H03L 7/1976 |
| 11,595,028 | B2 * | 2/2023 | Moslehi Bajestan | H03L 7/16 |
| 11,604,267 | B2 * | 3/2023 | Parisi | H03J 5/24 |
| 11,632,116 | B2 * | 4/2023 | Perrott | H03L 7/087 327/156 |
| 11,774,915 | B2 * | 10/2023 | Abdulaziz | H03L 7/087 327/159 |
| 11,784,649 | B2 * | 10/2023 | Perrott | H03L 7/093 375/376 |
| 11,831,279 | B2 * | 11/2023 | Seebacher | H03F 3/19 |
| 11,870,446 | B2 * | 1/2024 | Perrott | H03L 7/1976 |
| 11,879,963 | B2 * | 1/2024 | Parisi | H03L 7/193 |
| 12,032,341 | B2 * | 7/2024 | Abdulaziz | G04F 10/005 |
| 12,068,752 | B2 * | 8/2024 | Lee | H03L 7/0998 |
| 12,149,254 | B2 * | 11/2024 | Wang | H03L 7/093 |
| 12,184,292 | B2 * | 12/2024 | Belz | H03L 7/093 |
| 12,210,089 | B2 * | 1/2025 | Parisi | H03B 5/1228 |
| 12,308,850 | B2 * | 5/2025 | Yasotharan | H03L 7/183 |
| 2009/0268859 | A1 * | 10/2009 | Sun | H03L 7/00 375/376 |
| 2010/0141328 | A1 * | 6/2010 | Meninger | H03L 7/0816 327/512 |
| 2013/0222067 | A1 * | 8/2013 | Yin | H03L 7/099 331/25 |
| 2016/0373120 | A1 * | 12/2016 | Caffee | H03L 7/0891 |
| 2017/0194976 | A1 * | 7/2017 | Nonis | H04L 7/033 |
| 2017/0201259 | A1 * | 7/2017 | Lee | H03L 7/0991 |
| 2017/0346493 | A1 * | 11/2017 | Markulic | H03L 7/085 |
| 2019/0268008 | A1 * | 8/2019 | Khoury | H03L 7/0995 |
| 2019/0268010 | A1 * | 8/2019 | Wu | G04F 10/005 |
| 2020/0083873 | A1 * | 3/2020 | Wu | H03L 7/0996 |
| 2021/0143823 | A1 * | 5/2021 | Sievert | H03M 1/1071 |
| 2021/0409007 | A1 * | 12/2021 | Moslehi Bajestan | H03K 5/00006 |
| 2022/0043137 | A1 * | 2/2022 | Parisi | G01S 13/584 |
| 2022/0149849 | A1 * | 5/2022 | Lin | H03L 7/1976 |
| 2022/0224343 | A1 * | 7/2022 | Perrott | H03L 7/04 |
| 2022/0224348 | A1 * | 7/2022 | Perrott | H03L 7/093 |
| 2023/0194694 | A1 * | 6/2023 | Parisi | G01S 13/931 342/128 |
| 2023/0387925 | A1 * | 11/2023 | Wang | H03L 7/089 |
| 2024/0030927 | A1 * | 1/2024 | Belz | H03L 7/08 |
| 2024/0039542 | A1 * | 2/2024 | Perrott | H03L 7/093 |
| 2024/0106444 | A1 * | 3/2024 | Yasotharan | H03L 7/0818 |
| 2024/0146311 | A1 * | 5/2024 | Perrott | H03L 7/085 |
| 2024/0151844 | A1 * | 5/2024 | Parisi | G01S 13/931 |
| 2024/0219953 | A1 * | 7/2024 | Choi | G06F 1/08 |
| 2025/0167797 | A1 * | 5/2025 | Galton | H03L 7/0991 |

FOREIGN PATENT DOCUMENTS

| | | | | |
|---|---|---|---|---|
| CN | 102916693 | A | * | 2/2013 | |
| CN | 102916693 | B | * | 3/2014 | |
| CN | 103684467 | A | * | 3/2014 | |
| CN | 105610432 | A | * | 5/2016 | H03M 1/0836 |
| CN | 103125073 | B | * | 9/2016 | H03L 7/093 |
| CN | 103490774 | B | * | 3/2017 | H03L 7/087 |
| CN | 107024855 | A | * | 8/2017 | H03M 1/1014 |
| CN | 107342738 | A | * | 11/2017 | |
| CN | 102017418 | B | * | 6/2018 | H03L 7/0802 |
| CN | 105610432 | B | * | 2/2019 | H03M 1/002 |
| CN | 110233619 | A | * | 9/2019 | H03L 7/18 |
| CN | 111386657 | A | * | 7/2020 | H03L 7/093 |
| CN | 111865300 | A | * | 10/2020 | H03L 7/0802 |
| CN | 113179100 | A | * | 7/2021 | H03L 7/18 |
| CN | 114063078 | A | * | 2/2022 | H03L 7/103 |
| CN | 111865300 | B | * | 5/2022 | H03L 7/0805 |
| CN | 114499504 | A | * | 5/2022 | H03L 7/085 |
| CN | 114509929 | A | * | 5/2022 | G04F 10/005 |
| CN | 114650058 | A | * | 6/2022 | H03M 1/1245 |
| CN | 114765459 | A | * | 7/2022 | H03L 7/1976 |
| CN | 114765461 | A | * | 7/2022 | H03L 7/1976 |
| CN | 115001489 | A | * | 9/2022 | H03F 1/3241 |
| CN | 113179100 | B | * | 11/2022 | H03L 7/18 |
| CN | 115421367 | A | * | 12/2022 | G04F 10/005 |
| CN | 115685723 | A | * | 2/2023 | |
| CN | 115882861 | A | * | 3/2023 | |
| CN | 111164894 | B | * | 8/2023 | H03L 7/081 |
| CN | 116671015 | A | * | 8/2023 | H03L 7/087 |
| CN | 111386657 | B | * | 9/2023 | H03L 7/093 |
| CN | 114509929 | B | * | 9/2023 | G04F 10/005 |
| CN | 116743163 | A | * | 9/2023 | H03L 7/1974 |
| CN | 113456094 | B | * | 11/2023 | A61B 6/4241 |
| CN | 117223223 | A | * | 12/2023 | H03L 7/0818 |
| CN | 117375606 | A | * | 1/2024 | H03L 7/0818 |
| CN | 117439609 | A | * | 1/2024 | H03M 1/50 |
| CN | 115421367 | B | * | 2/2024 | G04F 10/005 |
| CN | 117439609 | B | * | 3/2024 | H03M 1/50 |
| CN | 117953939 | A | * | 4/2024 | H03L 7/18 |

(56) References Cited

FOREIGN PATENT DOCUMENTS

| | | | | | |
|---|---|---|---|---|---|
| CN | 118262756 | A | * | 6/2024 | .............. G06F 1/06 |
| CN | 114650058 | B | * | 7/2024 | ......... H03M 1/1215 |
| CN | 115001489 | B | * | 3/2025 | ............ H03L 7/093 |
| CN | 119834798 | A | * | 4/2025 | |
| CN | 114063078 | B | * | 7/2025 | ......... H03B 5/1212 |
| DE | 112017007753 | T5 | * | 4/2020 | ......... G04F 10/005 |
| DE | 102017100148 | B4 | * | 2/2023 | ............ H03L 7/093 |
| DE | 112023001297 | T5 | * | 1/2025 | ............ H03L 1/00 |
| EP | 2782255 | A1 | * | 9/2014 | ............. H03L 7/16 |
| EP | 2853029 | B1 | * | 5/2016 | ......... H03L 7/0805 |
| EP | 3249817 | A1 | * | 11/2017 | ............ H03L 7/081 |
| EP | 3306819 | A1 | * | 4/2018 | ............. G06F 1/12 |
| EP | 3249817 | B1 | * | 12/2018 | ............ H03L 7/081 |
| EP | 3021176 | B1 | * | 6/2021 | ......... H03M 1/0836 |
| EP | 3695511 | B1 | * | 1/2022 | ............ H03L 7/085 |
| EP | 3701631 | B1 | * | 1/2022 | ............ H03L 7/093 |
| EP | 4181454 | A1 | * | 5/2023 | ............ H03L 7/093 |
| EP | 3756276 | B1 | * | 7/2024 | ............. H03K 5/26 |
| EP | 4472077 | A2 | * | 12/2024 | ............. H03K 5/26 |
| EP | 4472079 | A1 | * | 12/2024 | ............ H03L 7/093 |
| GB | 2184869 | A | * | 7/1987 | ......... G11B 5/59688 |
| IT | 102020000019786 | B1 | * | 11/2022 | |
| JP | 2007312334 | A | * | 11/2007 | |
| KR | 20100066235 | A | * | 6/2010 | ............. H03L 7/07 |
| KR | 20170083816 | A | * | 7/2017 | ............ H03L 7/085 |
| KR | 20220023196 | A | * | 3/2022 | ......... H03L 7/0814 |
| KR | 20220027737 | A | * | 3/2022 | ......... H03L 7/0991 |
| KR | 20220055979 | A | * | 5/2022 | ............ H03L 7/093 |
| KR | 20230068985 | A | * | 5/2023 | ............ H03L 7/097 |
| KR | 20240058760 | A | * | 5/2024 | ............. H03M 1/66 |
| KR | 20240104418 | A | * | 7/2024 | ............. G06F 1/06 |
| TW | 1376100 | B | * | 11/2012 | ............ H03L 7/113 |
| TW | 1482436 | B | * | 4/2015 | ............ H03L 7/099 |
| TW | 202220386 | A | * | 5/2022 | .......... H03L 7/1976 |
| TW | 202228401 | A | * | 7/2022 | ............ H03L 7/085 |
| TW | 1786913 | B | * | 12/2022 | ............ H03L 7/093 |
| WO | WO-2009134880 | A1 | * | 12/2009 | .......... H03L 7/0802 |
| WO | WO-2019017864 | A1 | * | 1/2019 | .......... G04F 10/005 |
| WO | WO-2019125300 | A1 | * | 6/2019 | ............ H03L 7/093 |
| WO | WO-2019164626 | A2 | * | 8/2019 | ............. H03K 5/26 |
| WO | WO-2021213668 | A1 | * | 10/2021 | ............. H03L 7/08 |
| WO | WO-2022155176 | A1 | * | 7/2022 | ............ H03L 7/081 |
| WO | WO-2024246637 | A1 | * | 12/2024 | ............ H03L 7/093 |

OTHER PUBLICATIONS

N. Pavlovic and J. Bergervoet, "A 5.3GHZ digital-to-time-converter-based fractional-N all-digital PLL," 2011 IEEE International Solid-State Circuits Conference, San Francisco, CA, USA, 2011, pp. 54-56, (Year: 2011).*

E. Helal, E. Alvarez-Fontecilla, A. I. Eissa and I. Galton, "A Time Amplifier Assisted Frequency-to-Digital Converter Based Digital Fractional-N PLL," in IEEE Journal of Solid-State Circuits, vol. 56, No. 9, pp. 2711-2723, Sep. 2021 (Year: 2021).*

D. Huang, W. Li, J. Zhou, N. Li, J. Ren and J. Chen, "A time-to-digital converter based AFC for wideband frequency synthesizer," 2012 IEEE International Symposium on Circuits and Systems (ISCAS), Seoul, Korea (South), 2012, pp. 1299-1302, (Year: 2012).*

* cited by examiner

300

400

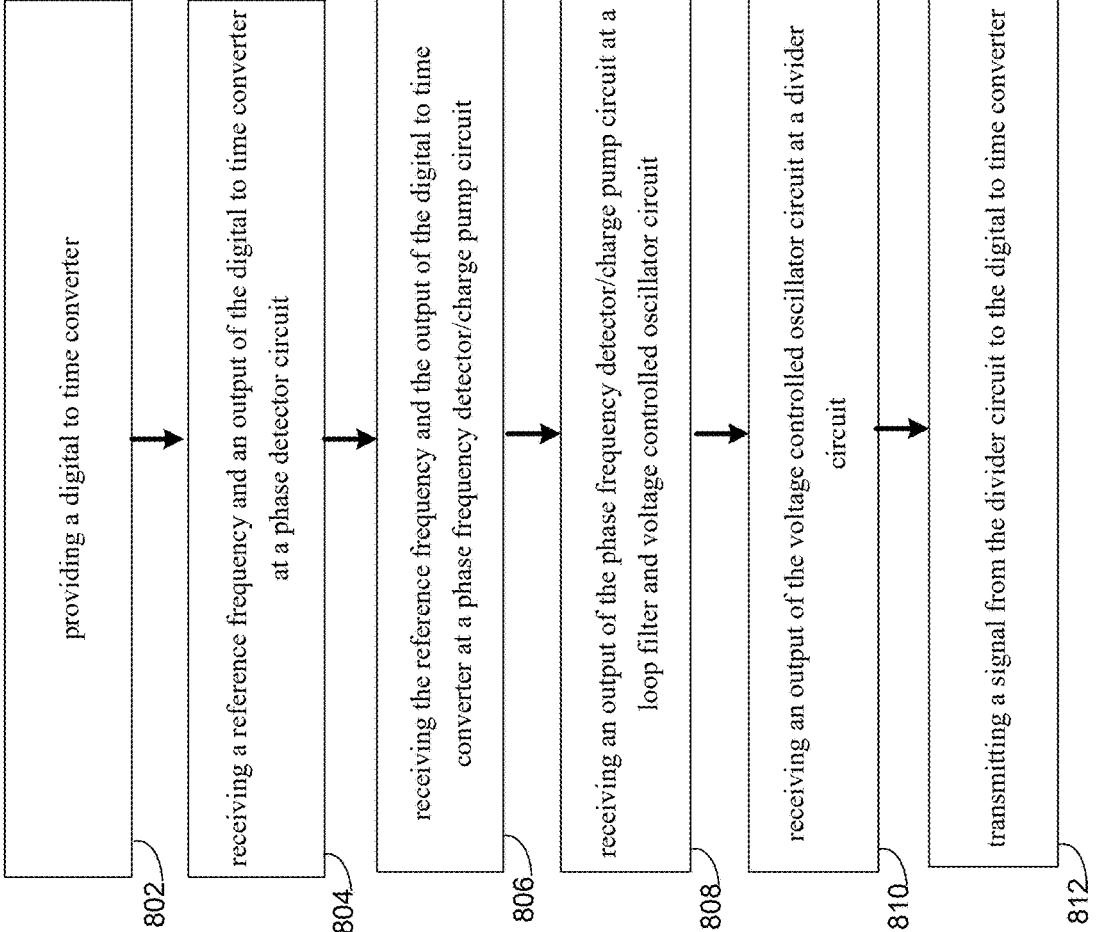

providing a digital to time converter receiving a reference frequency and an output of the digital to time converter at a phase detector circuit receiving the reference frequency and the output of the digital to time converter at a phase frequency detector/charge pump circuit receiving an output of the phase frequency detector/charge pump circuit at a loop filter and voltage controlled oscillator circuit receiving an output of the voltage controlled oscillator circuit at a divider circuit transmitting a signal from the divider circuit to the digital to time converter

SUBRANGING DIGITAL TO TIME CONVERTER-BASED FRACTIONAL PHASE LOCKED LOOP ARCHITECTURE

BACKGROUND

A fractional-N phase locked loop circuit (PLL) may synthesize voltage-controlled oscillator (VCO) frequencies that are not integer multiplication factors of the reference frequencies. This is usually done by using a delta sigma modulator (DSM) that modulates the divider (MMDIV) division rate from each reference cycle to the next to achieve a certain average division ratio. The average VCO frequency is therefore a non-integer multiple of the reference frequency.

SUMMARY

In one or more embodiments of the present disclosure, a subranging digital to time converter-based fractional phase locked loop circuit is provided. The circuit may include a digital to time converter and a phase detector circuit configured to receive a reference frequency and an output of the digital to time converter. The circuit may further include a phase frequency detector/charge pump circuit configured to receive the reference frequency and the output of the digital to time converter. The circuit may also include a loop filter and voltage-controlled oscillator circuit configured to receive an output of the phase frequency detector/charge pump circuit. The circuit may further include a divider circuit configured to receive an output of the voltage-controlled oscillator circuit and to transmit a signal to the digital to time converter.

One or more of the following features may be included. In some embodiments, the phase detector circuit may include a Bang-Bang phase detector. The digital to time converter may include a coarse digital to time converter and a fine digital to time converter. The fine digital to time converter may receive an input from the course digital to time converter to generate a sub-ranging digital to time converter. The coarse digital to time converter may utilize pseudo-random signal-based randomization. The fine digital to time converter may calibrate a fine digital to time converter gain error. The circuit may include a complementary fine digital to time converter. The circuit may also include a delta sigma modulator circuit configured to produce a number and to transmit the number to the divider circuitry. The fine digital to time converter may not include a non-linear calibration. The coarse digital to time converter may not include a calibration.

In one or more embodiments of the present disclosure a subranging digital to time converter-based fractional phase locked loop method is provided. The method may include providing a digital to time converter and receiving a reference frequency and an output of the digital to time converter at a phase detector circuit. The method may further include receiving the reference frequency and the output of the digital to time converter at a phase frequency detector/ charge pump circuit. The method may also include receiving an output of the phase frequency detector/charge pump circuit at a loop filter and voltage-controlled oscillator circuit. The method may further include receiving an output of the voltage-controlled oscillator circuit at a divider circuit and transmitting a signal from the divider circuit to the digital to time converter.

One or more of the following features may be included. In some embodiments, the phase detector circuit may include a Bang-Bang phase detector. The digital to time converter may include a coarse digital to time converter and a fine digital to time converter. The fine digital to time converter may receive an input from the course digital to time converter to generate a sub-ranging digital to time converter. The coarse digital to time converter may utilize pseudo-random signal-based randomization. The fine digital to time converter may calibrate a fine digital to time converter gain error. The circuit may include a complementary fine digital to time converter. The circuit may also include a delta sigma modulator circuit configured to produce a number and to transmit the number to the divider circuitry. The fine digital to time converter may not include a non-linear calibration. The coarse digital to time converter may not include a calibration.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 8 is a flowchart depicting operations consistent with embodiments of the present disclosure.

DETAILED DESCRIPTION

Figure 1:
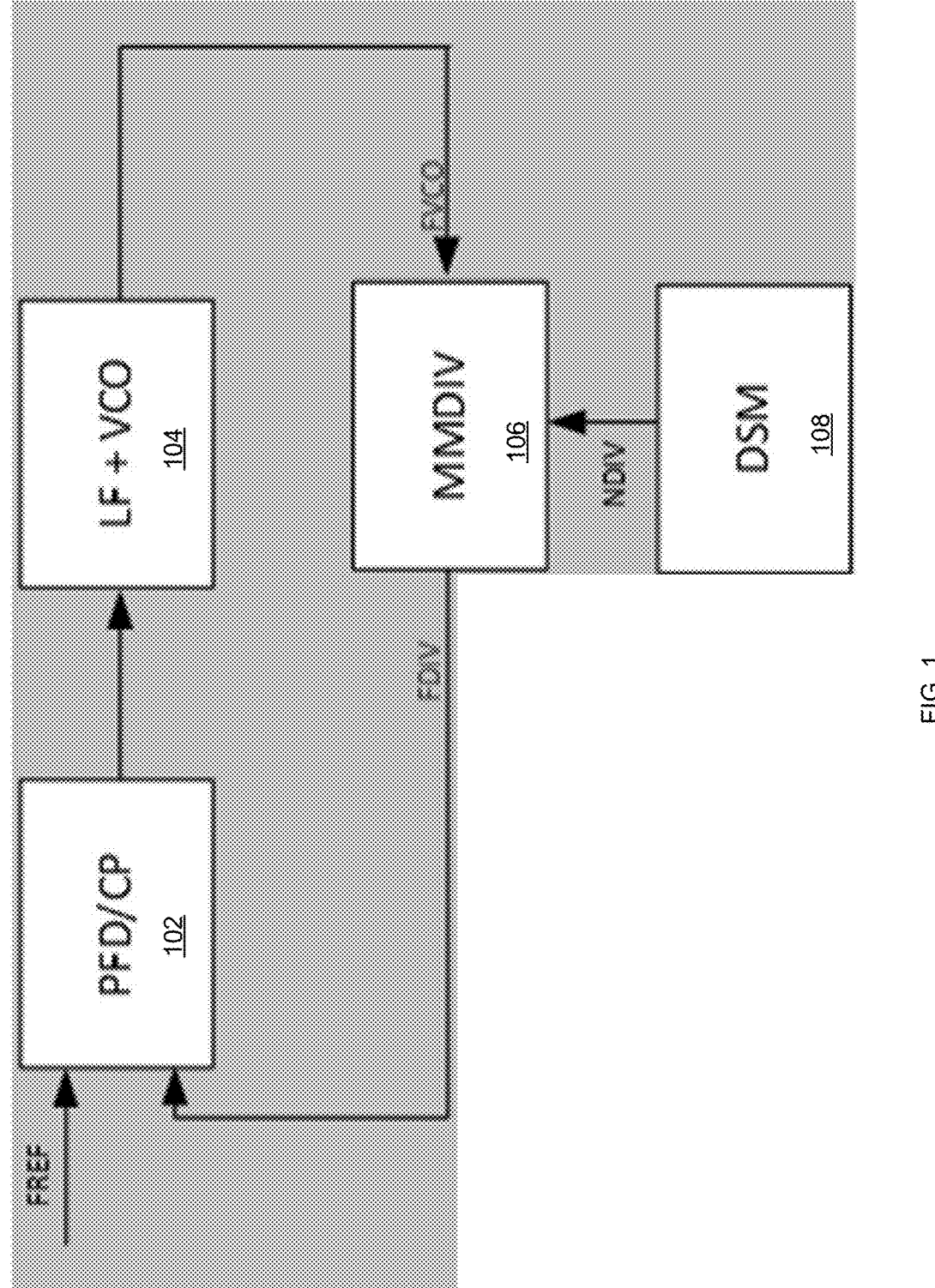
FIG. 1 is an example block diagram of a fractional-N phase-locked loop architecture consistent with embodiments of the present disclosure.

Referring now to FIG. 1, an example block diagram of a fractional-N phase-locked loop architecture 100 consistent with embodiments of the present disclosure is provided. This architecture may include phase frequency detector/charge pump circuit 102 configured to receive a reference frequency. Loop filter and voltage-controlled oscillator circuit 104 configured to receive an output of phase frequency detector/charge pump circuit 102. Divider circuit 106 may be configured to receive an output of VCO circuit 104 and to transmit a signal to phase frequency detector/charge pump circuit 102. Delta sigma modulator 108 may provide a signal to divider circuit 106.

In some embodiments, fractional-N phase-locked loop architecture 100 may synthesize VCO frequencies that are not integer multiplication factors of the reference frequencies. This may be performed by using delta sigma modulator 108 that modulates the divider (MMDIV) division rate from each reference cycle to the next to achieve a certain average division ratio. The average VCO frequency is therefore a non-integer multiple of the reference frequency.

Figure 2:
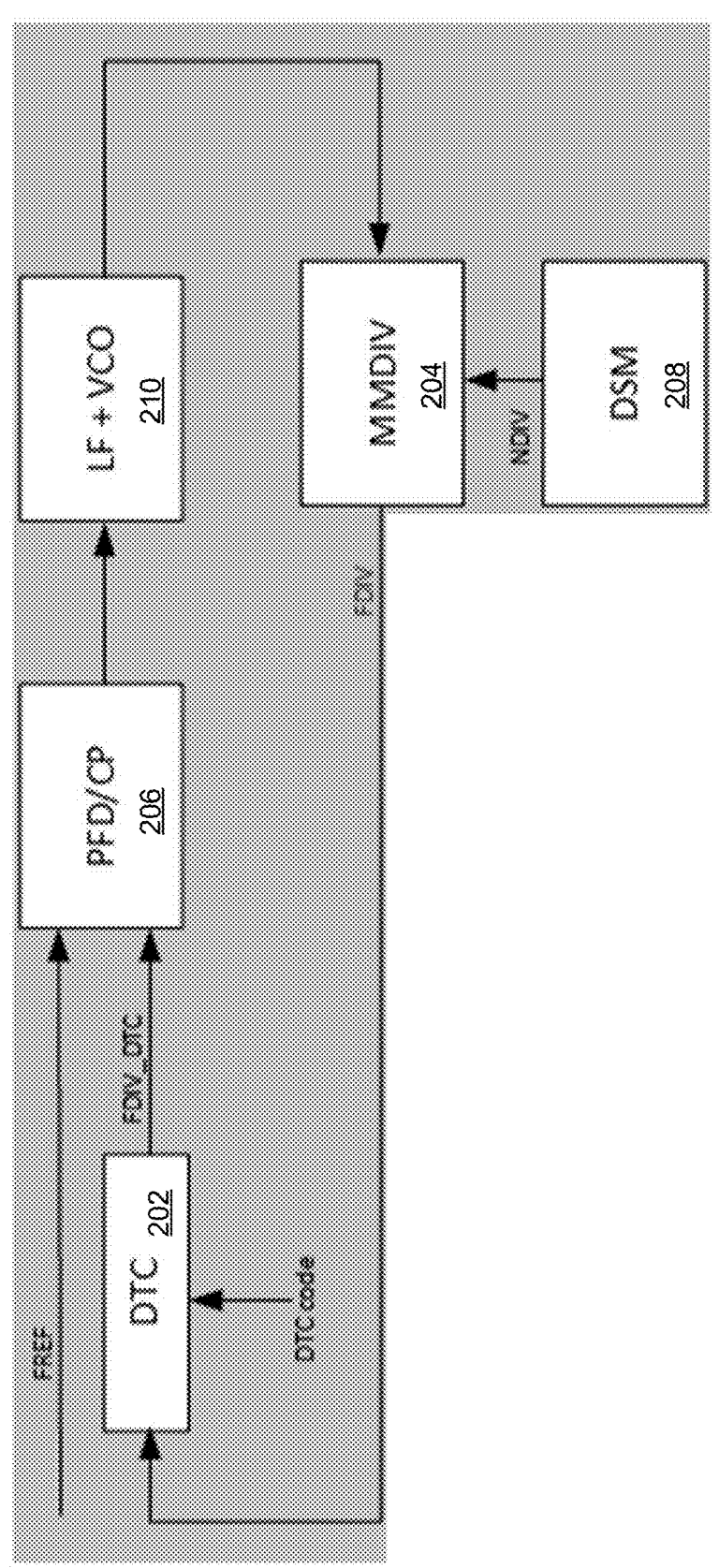
FIG. 2 is an example block diagram of a fractional-N phase-locked loop architecture with digital to time-based correction consistent with embodiments of the present disclosure.

Referring now to FIG. 2, an example block diagram of a fractional-N phase-locked loop architecture 200 with digital to time-based correction 202 consistent with embodiments of the present disclosure is provided. The use of DTC 202 for fractional frequency synthesis may be used to reduce the timing jitter injected by divider 204 due to the delta-sigma modulation. DTC 202 may predict and cancel the large timing jitter injected by divider 204 before it reaches the phase frequency detector (PFD) 206 in PLL loop 200. This may be performed without altering the frequency being achieved with the division ratio modulation by delta-sigma modulator (DSM) 208. Without DTC 202, large timing jitter may be seen by PFD 206 which may result in significant jitter at the PLL output even after being filtered by loop filter 210. In addition to this, the large timing jitter at PFD 206 input (in the order of multiple clock cycles of VCO clock) excite numerous non-linearities in PFD/CP 206 and VCO gain (Kvco), resulting in folding of the high frequency DSM noise into low frequency and thereby disrupting close-in phase noise. A well-designed DTC removes this timing jitter before it reaches PFD 206. Accordingly, DTC 202 needs to be accurate. It also needs to be linear to prevent DSM noise folding. Another important issue that is inherent to the DSM modulation, is the presence of limit cycles. This effect becomes severe in certain fractional codes. In those cases, the limit cycle frequency falls within the PLL bandwidth and the DTC errors may go through PLL loop 200 without any attenuation at all. As a result, a very linear DTC may be needed.

A second or third order DSM 208 is normally needed to modulate the divider division factor. A first order modulator may not work, as there is an inherent integration from frequency to phase in divider 204. For a second order modulator (and more so for a third order with or without out-of-band gain suppression), the perturbation of the division ratio becomes larger. For example, if the goal is to hit a division ratio of (Nint+0.1) (where "Nint" is the integer division ratio and 0.1 is the fractional ratio), the divider division ratio may be switched between Nint and Nint+1. However, the operation of DSM 208 is such that, for modulator 208 to be stable, it may swing between Nint−2 to Nint+2. This may create large instantaneous timing jitter at the divider output. Accordingly, DTC 202, in order to remove these timing errors before they reach PFD 206, may need to handle a fairly large amount of range. In the case where divider 204 instantaneous division ratio fluctuates between Nint−2, Nint+2, DTC 202 correction range may need to cover at least 3Tvco, where Tvco is the time period of the VCO clock. For a 12.5 GHz PLL, that translates to 240 ps, which is a very large range practically. It is quite difficult to have a DTC that is linear in such a large range. To address these issues, a sub-ranging DTC structure may be needed so that the fine DTC may be linear enough in a smaller range, and it would not need a polynomial type of correction.

Figure 3:
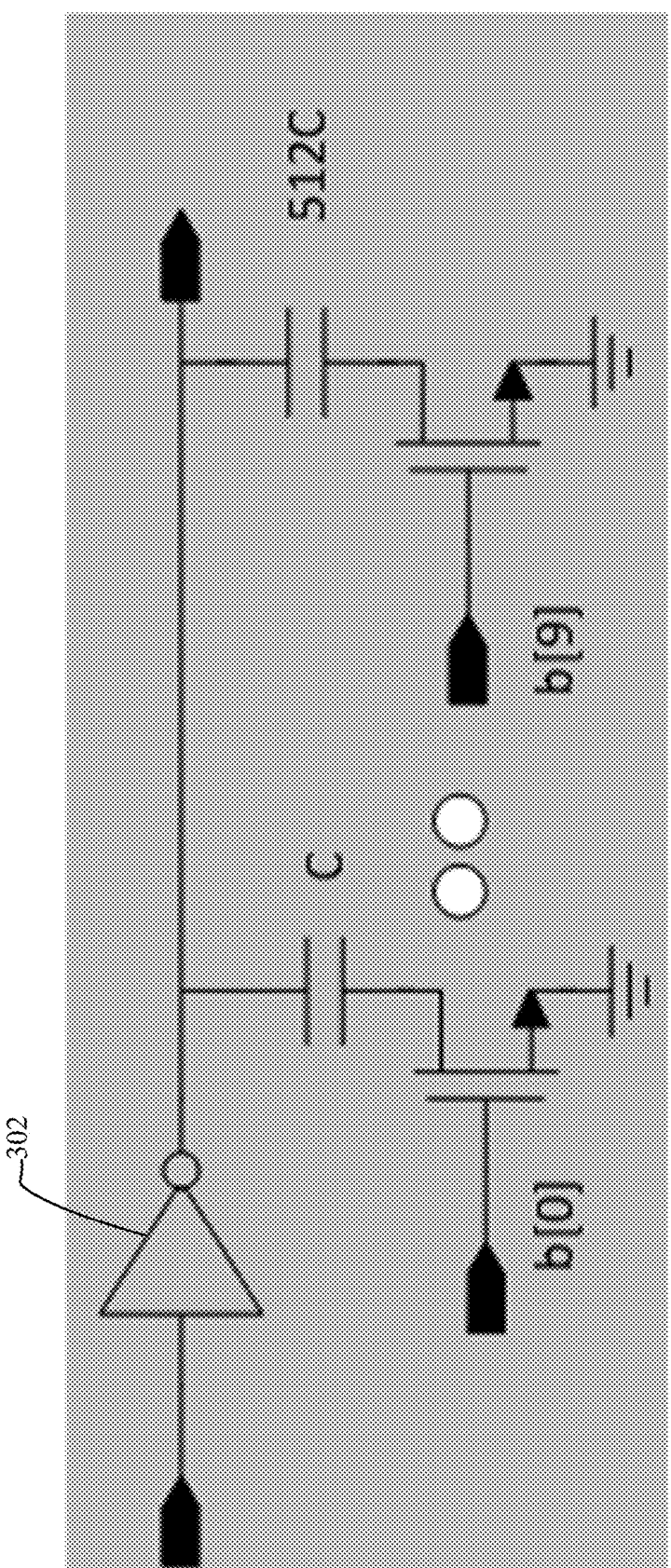
FIG. 3 is an example block diagram of a digital to time-based correction structure consistent with embodiments of the present disclosure.
Figure 4:
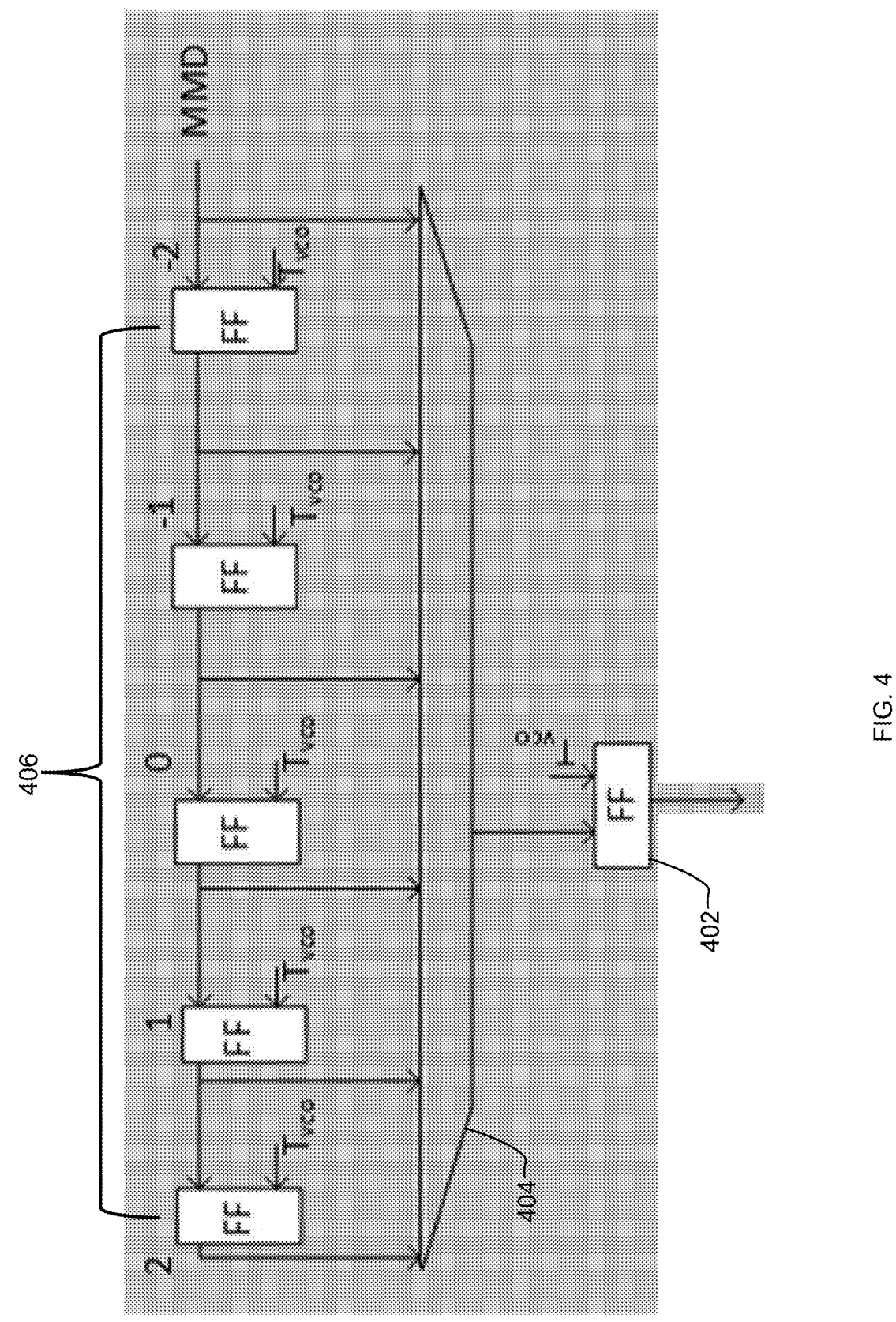
FIG. 4 is an example block diagram of a coarse digital to time-based correction structure consistent with embodiments of the present disclosure.

Referring now to FIGS. 3-4, an example block diagram of a digital to time-based correction structure 300 and a course DTC structure 400 consistent with embodiments of the present disclosure are provided. FIG. 3 shows one example structure of a DTC (digital to time converter) 300. In this example, a digital code may be converted to a time delay by changing the amount of capacitance connected to inverter 302. See, "A 28-nm 75-fsrms Analog Fractional-N Sampling PLL With a Highly Linear DTC Incorporating Background DTC Gain Calibration and Reference Clock Duty Cycle Correction" JSSC May 2019. If a peak-to-peak integral non-linearity (INL) of 100 fs or lower needs to be achieved, the maximum delay range that may achieved with this structure is about ~40 ps. Naturally, a range of 240 ps may be too large for this structure, for the INL requirement. Accordingly, a subranging DTC structure may be needed. A subranging DTC has a coarse-fine structure, where the coarse portion addresses delays in integer multiples of Tvco, and the remaining portion (0 to Tvco) may be addressed by a fine DTC that may be implemented similar to the example shown in FIG. 3. One example coarse DTC structure 400 is provided in FIG. 4, however, this is provided merely by way of example as numerous types of fine and coarse DTC structures may be used without departing from the scope of the present disclosure.

Figures 6A, 6B:
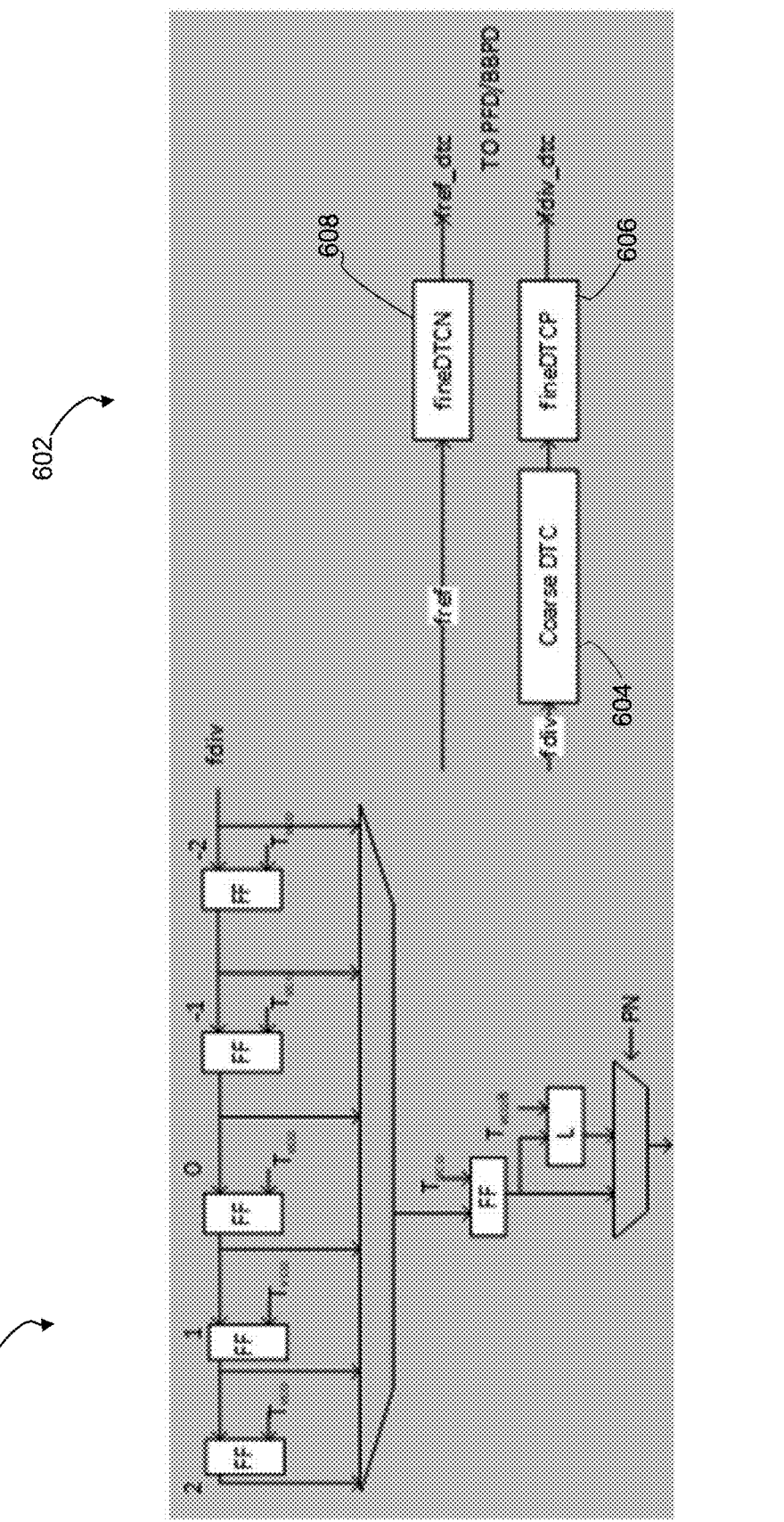
FIG. 6A is an example block diagram of a coarse digital to time-based correction structure consistent with embodiments of the present disclosure.
FIG. 6B is an example block diagram of a digital to time-based correction structure with complementary fine DTC consistent with embodiments of the present disclosure.

In some embodiments, the fine DTC structure may take the input from the output of the coarse DTC and a sub-ranging DTC may be realized. The coarse DTC may realize delays in multiples of Tvco and the remaining delay between 0-Tvco may be handled by the fine DTC. The input to the coarse DTC may be the MMD output. For a 12.5 GHz VCO frequency, the Tvco may be 80 ps, and the range may still be a bit too large for the fine DTC. Accordingly, a complementary operation may be used that halves the range for each single-ended fine DTC. Additionally, the complementary (pseudo differential) mode of operation (as shown in FIG. 6B) naturally cancels out the predominantly second order nature of distortion from the single-ended DTC and provides a much smaller third order distortion. In this way, it is possible to realize a very linear DTC structure. In FIG. 4, the sampling by the final flop 402 may be needed to remove any mismatch between the various inputs of multiplexer 404.

In some embodiments, the sub-ranging structures described herein are very different from the sub-ranging structure of prior systems, where the controls to the DTC are sub-ranged, but the DTC structure is not sub-ranging. See, "An Adaptive Pre-Distortion Technique to Mitigate the DTC Nonlinearity in Digital PLLs" JSSC April 2014. Because of this, the coarse codes of the DTC of prior systems needs predistortion to calibrate the DTC INL. In the present disclosure, the coarse code delays are correct by design, since they are integer multiples of the VCO clock period. The coarse DTC structure 400 included herein may require only a plurality of flip-flops 406 and multiplexer 404. The output of multiplexer 404 in FIG. 4 may be resampled with another flop 402 to remove any path mismatches induced by multiplexer 404, and hence coarse DTC 400 may be calibration-free. Embodiments of the present disclosure propose a true sub-ranging DTC having lower area, lower power, lower random jitter, etc. and requiring no INL calibration.

Embodiments included herein may reduce the number of bits in the fine DTC by 2 while only adding a few flip-flops and multiplexers.

Figure 5:
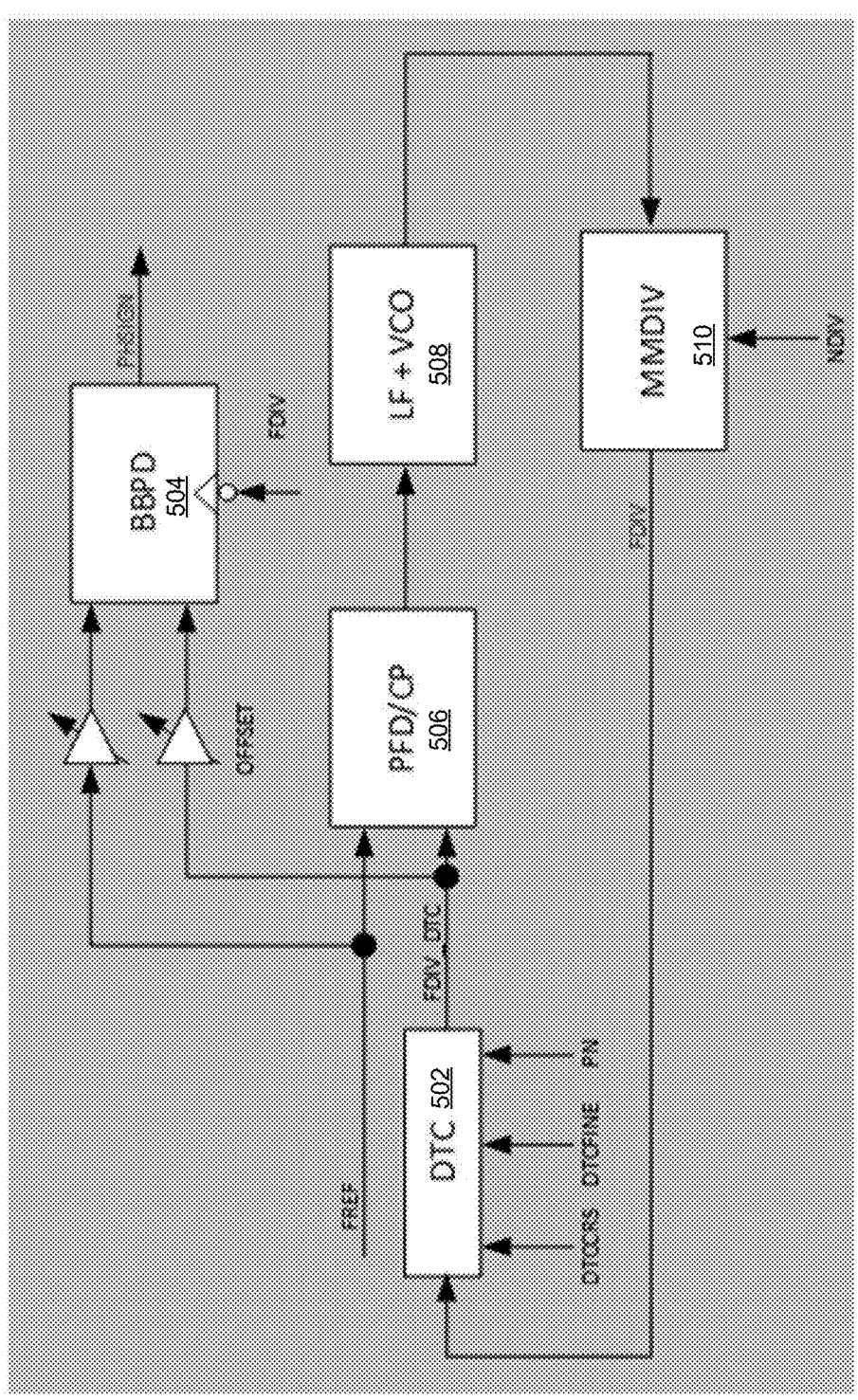
FIG. 5 is an example block diagram of a fractional-N phase-locked loop architecture with digital to time-based correction and a Bang-Bang phase detector consistent with embodiments of the present disclosure.

Referring also to FIG. 5, an example block diagram 500 showing a fractional-N phase-locked loop architecture with digital to time-based correction and a Bang-Bang phase detector is provided. The circuit may include digital to time converter 502 and phase detector circuit 504 configured to receive a reference frequency and an output of digital to time converter 502. The circuit may further include a phase frequency detector/charge pump circuit 506 configured to receive the reference frequency and the output of digital to time converter 502. The circuit may also include a loop filter and voltage-controlled oscillator circuit 508 configured to receive an output of phase frequency detector/charge pump circuit 506. The circuit may further include a divider circuit 510 configured to receive an output of the phase frequency detector/charge pump circuit 506 and to transmit a signal to the digital to time converter 502.

In some embodiments, there are various non-idealities and associated calibration methods for the fine DTC. There are limitations of the limit cycle/idle tone behavior (because the DSM is processing DC inputs) and the modifications needed to DTC 502 and associated calibration algorithms because of this issue. One important non-ideality of the (fine) DTC is improper gain. Embodiments included herein may be configured to set the fine DTC range to be exactly one VCO period, however due to the dependence of the transistor resistance on PVT, it is not possible to define the gain precisely. Also, as the division ratio (integer or fraction) changes, the required gain changes. Hence, it may be necessary to have a background calibration algorithm to "learn" the gain that minimizes the error from DTC 502. In this respect, it should be noted that if DTC 502 performs well, the reference and the feedback clock at the input of PFD 506 may be nominally aligned for every reference cycle. If they are not, that may provide information of the DTC non-idealities. An additional phase detector 504 (e.g., Bang-Bang) may be added to analyze the two phases along with PFD 506 in the PLL loop, that provides an early/late signal. This signal may be used in a calibration algorithm to adapt the fine DTC gain. Additionally, since there may be mismatches in the charge pump currents, the PLL may not lock to a zero-phase offset. This may bias phase detector 504 and make it difficult to extract information about DTC non-idealities. As such, it is important to remove this bias from phase detector 504. An additional offset (in terms of delay) tuning may be added before phase detector 504 to unbias its output in the presence of charge pump mismatch or leakage from the loop filter.

Referring now to FIGS. 6A-6B and 7A-7B, examples of DTC structures 600 and an exemplary circuit diagram 700 of the digital logic are provided. FIG. 6A is an example block diagram of a coarse digital to time-based correction structure 600 consistent with embodiments of the present disclosure and FIG. 6B is an example block diagram of a complementary digital to time-based correction structure 602 with complementary fine DTC consistent with embodiments of the present disclosure.

In some embodiments, DTC gain is a parameter that may require calibration. The logic provided in FIG. 7A-7B may be used to generate the Ndiv for MMDIV, DTC coarse and fine code as well as to calibrate the fine DTC gain and BBPD offset. It is observed that at certain fractional codes (e.g., 0, 0.25) low frequency limit cycles may be present in the DSM output and the DTC code, which may cause the DTC error to pass through the loop filter and show up in the feedback path. This, in turn, may remove the error information from the BBPD input and make the algorithm incapable of learning the gain error of the fine DTC in the presence of low frequency limit cycles. To prevent such a situation, randomization may be added to coarse DTC 604 and fine DTC 606 as shown in FIGS. 6A-6B and 7A-7B. Depending on a phase noise signal (PN) a 0.5Tvco delay may be added or subtracted to coarse DTC 604 and to keep the same overall DTC code, the same amount may be subtracted or added from or to fine DTC 606, 608. This excites different codes for fine DTC 606, 608 even though the overall DTC code (coarse and fine) may not be changing. This may help in learning the gain parameter of fine DTC 606, 608 even in presence of very low frequency limit cycles.

Figure 7A:
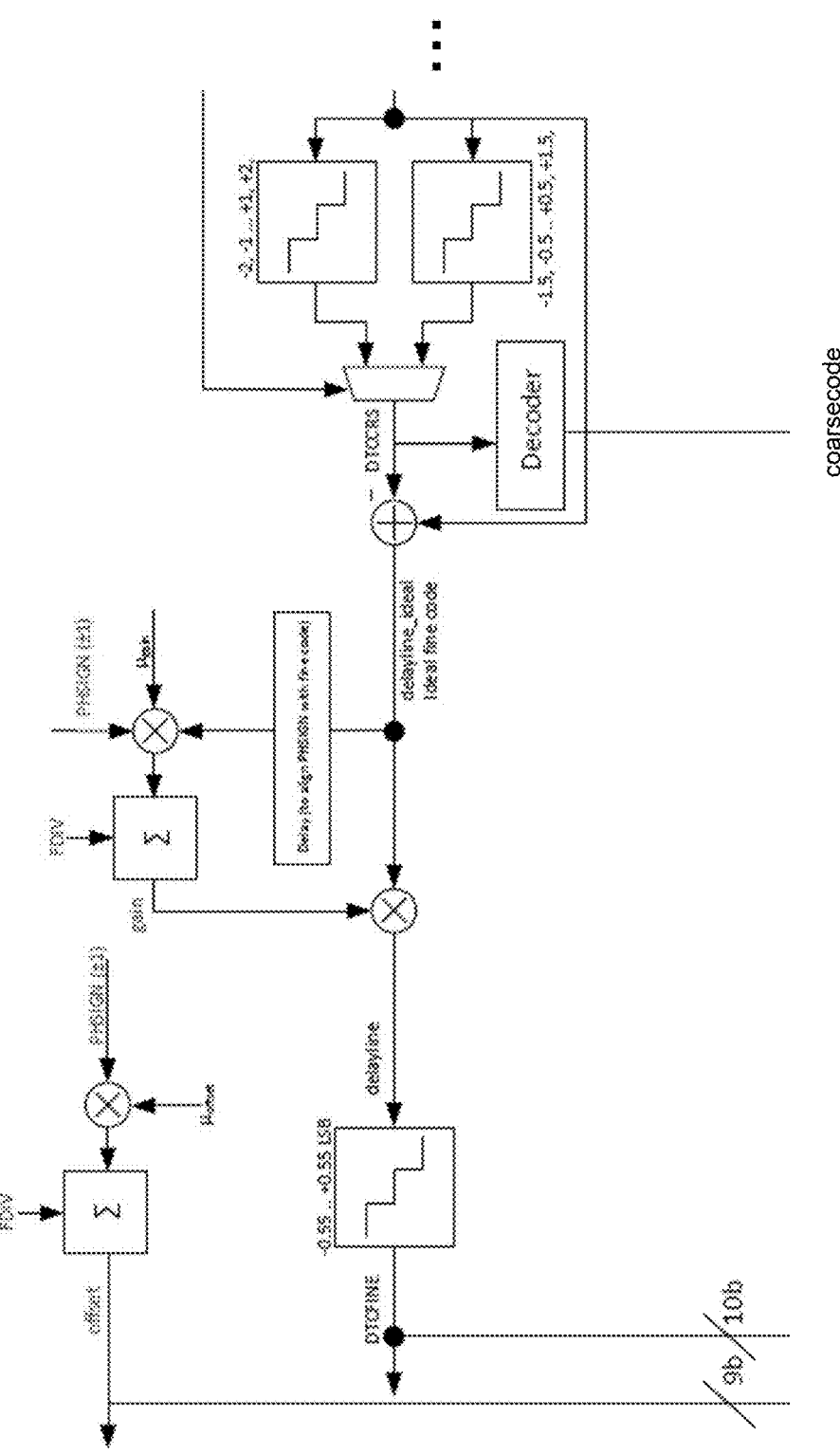
FIG. 7A-7B are example circuits consistent with embodiments of the present disclosure.
Figure 7B:
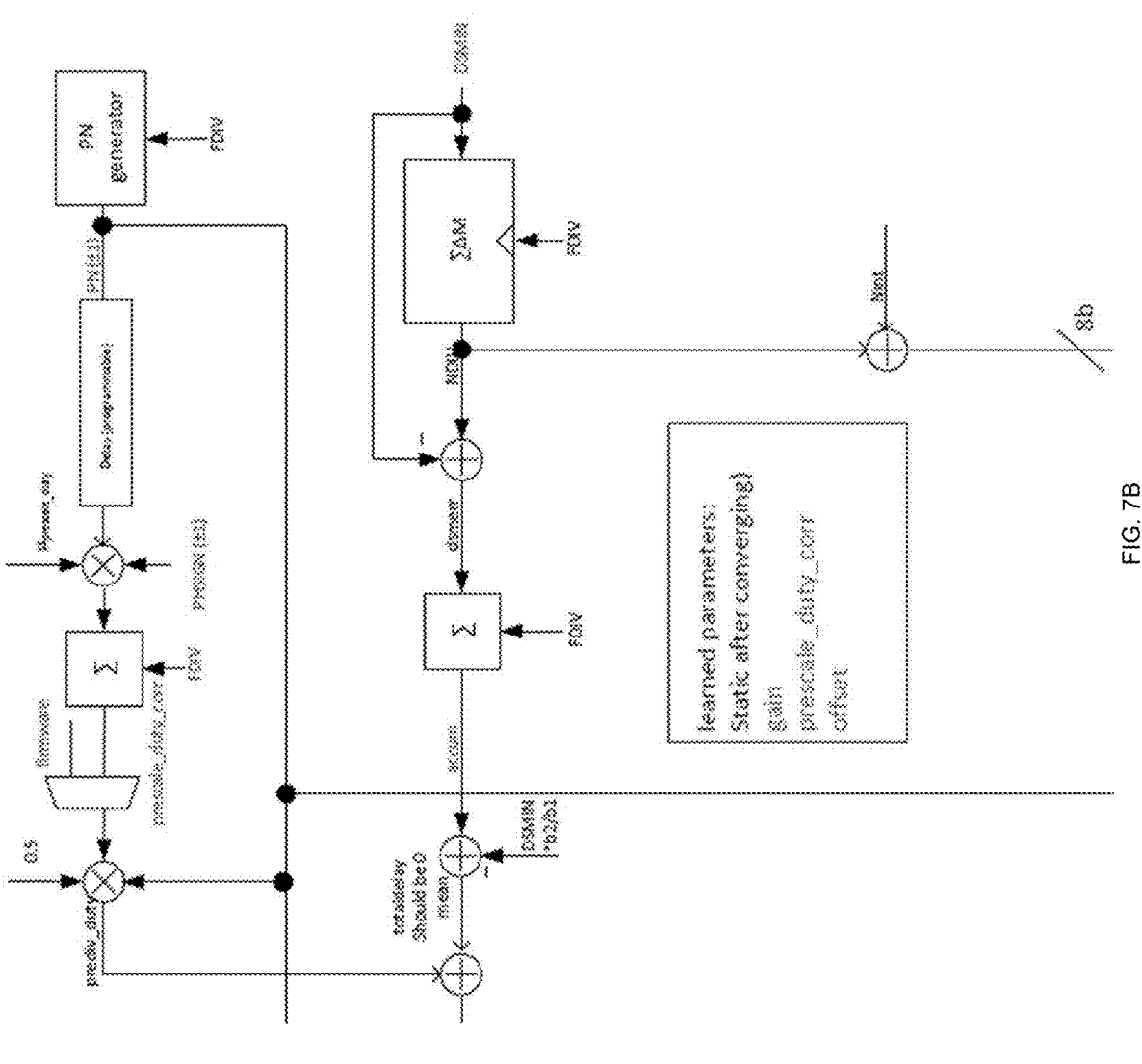

In some embodiments, and referring now to FIGS. 7A-7B, example circuits of digital logic that may be used to generate the fine and coarse codes as well as the calibration algorithms are provided. Numerous other approaches may also be used without departing from the scope of the present disclosure.

Embodiments included herein are directed towards a new sub-ranging DTC architecture for removing the DSM induced jitter in fractional frequency synthesis. The present disclosure proposes a pseudo-random signal based randomization in the coarse and fine DTC controls that help in calibrating the fine DTC gain error even in presence of low frequency limit cycles. Use of sub-ranging DTC makes it possible to use a highly linear fine DTC and does not require INL calibration for the fine DTC. The use of true sub-ranging (e.g., coarse and fine) DTC also helps reduce the number of bits in the (fine) DTC by 2 bits, thereby reducing the area by a factor of 4. The additional 2*b* of dynamic range may be handled by the coarse DTC and requires limited overhead.

Referring now to FIG. 8, a flowchart 800 depicting operations consistent with embodiments of the present disclosure is provided. According to flowchart 800, a subranging digital to time converter-based fractional phase locked loop method is provided. The method may include providing (802) a digital to time converter and receiving (804) a reference frequency and an output of the digital to time converter at a phase detector circuit. The method may further include receiving (806) the reference frequency and the output of the digital to time converter at a phase frequency detector/charge pump circuit. The method may also include receiving (808) an output of the phase frequency detector/charge pump circuit at a loop filter and voltage-controlled oscillator circuit. The method may further include receiving (810) an output of the phase frequency detector/charge pump circuit at a divider circuit and transmitting (812) a signal from the divider circuit to the digital to time converter. Numerous other operations are also within the scope of the present disclosure.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A subranging digital to time converter-based fractional phase locked loop circuit comprising:
   a digital to time converter including a coarse digital to time converter and a fine digital to time converter, wherein the coarse digital to time converter utilizes pseudo-random signal based randomization and the digital to time converter requires no integral nonlinearity calibration;

a phase detector circuit configured to receive a reference frequency and an output of the digital to time converter;

a phase frequency detector/charge pump circuit configured to receive the reference frequency and the output of the digital to time converter;

a loop filter and voltage-controlled oscillator (VCO) circuit configured to receive an output of the phase frequency detector/charge pump circuit, wherein the pseudo-random signal based randomization is configured to selectively add a fraction of a VCO period to a first delay associated with the coarse digital to time converter, and to simultaneously subtract the same fraction of the VCO period from a second delay associated with the fine digital to time converter; and a divider circuit configured to receive an output of the voltage-controlled oscillator circuit and to transmit a signal to the digital to time converter.

2. The circuit of claim 1, wherein the phase detector circuit includes a Bang-Bang phase detector.

3. The circuit of claim 1, wherein the fine digital to time converter receives an input from the course digital to time converter to generate a sub-ranging digital to time converter.

4. The circuit of claim 1, wherein the fine digital to time converter calibrates a fine digital to time converter gain error.

5. The circuit claim 1, further comprising a complementary fine digital to time converter.

6. The circuit of claim 1, further comprising a delta sigma modulator circuit configured to produce a number and to transmit the number to the divider circuitry.

7. The circuit of claim 1, wherein the fine digital to time converter does not include a non-linear calibration.

8. The circuit claim 1, wherein the coarse digital to time converter does not include a calibration.

9. A subranging digital to time converter-based fractional phase locked loop method comprising:

providing a digital to time converter including a coarse digital to time converter and a fine digital to time converter, wherein the coarse digital to time converter utilizes pseudo-random signal based randomization and the digital to time converter requires no integral nonlinearity calibration;

receiving a reference frequency and an output of the digital to time converter at a phase detector circuit;

receiving the reference frequency and the output of the digital to time converter at a phase frequency detector/charge pump circuit;

receiving an output of the phase frequency detector/charge pump circuit at a loop filter and voltage-controlled oscillator (VCO) circuit, wherein the pseudo-random signal based randomization is configured to selectively add a fraction of a VCO period to a first delay associated with the coarse digital to time converter, and to simultaneously subtract the same fraction of the VCO period from a second delay associated with the fine digital to time converter;

receiving an output of the voltage-controlled oscillator circuit at a divider circuit; and transmitting a signal from the divider circuit to the digital to time converter.

10. The method of claim 9, wherein the phase detector circuit includes a Bang-Bang phase detector.

11. The method of claim 9, further comprising:

receiving an input from the course digital to time converter at the fine digital to time converter to generate a sub-ranging digital to time converter.

12. The method of claim 9, further comprising:

calibrating a fine digital to time converter gain error at the fine digital to time converter.

13. The method of claim 9, further comprising a complementary fine digital to time converter.

14. The method of claim 9, further comprising a delta sigma modulator circuit configured to produce a number and to transmit the number to the divider circuitry.

15. The method of claim 9, wherein the fine digital to time converter does not include a non-linear calibration.

16. The method of claim 9, wherein the coarse digital to time converter does not include a calibration.

* * * * *